(12) United States Patent
Tsuchie et al.

(10) Patent No.: US 11,145,120 B2
(45) Date of Patent: Oct. 12, 2021

(54) CURVED SURFACE GENERATION DEVICE AND CURVED SURFACE GENERATION PROGRAM

(71) Applicants: Nihon Unisys, Ltd., Tokyo (JP); Yokohama National University, Yokohama (JP)

(72) Inventors: Shoichi Tsuchie, Tokyo (JP); Takashi Maekawa, Yokohama (JP)

(73) Assignees: Nihon Unisys, Ltd., Tokyo (JP); Yokohama National University, Yokohama (JP)

( * ) Notice: Subject to any disclaimer, the term of this patent is extended or adjusted under 35 U.S.C. 154(b) by 0 days.

(21) Appl. No.: 16/477,061

(22) PCT Filed: Nov. 28, 2017

(86) PCT No.: PCT/JP2017/042636
§ 371 (c)(1),
(2) Date: Jul. 10, 2019

(87) PCT Pub. No.: WO2018/131304
PCT Pub. Date: Jul. 19, 2018

(65) Prior Publication Data
US 2019/0333272 A1    Oct. 31, 2019

(30) Foreign Application Priority Data

Jan. 11, 2017    (JP) .............................. JP201-002602

(51) Int. Cl.
*G06T 17/30*    (2006.01)
*G06F 30/12*    (2020.01)
(Continued)

(52) U.S. Cl.
CPC .............. *G06T 17/30* (2013.01); *G06F 30/00* (2020.01)

(58) Field of Classification Search
CPC .......... G06F 30/00; G06F 30/10; G06F 30/12; G06T 17/30
See application file for complete search history.

(56) References Cited

U.S. PATENT DOCUMENTS

| 4,491,906 A | 1/1985 | Kishi et al. |
| 4,569,014 A | 2/1986 | Kishi et al. |

(Continued)

FOREIGN PATENT DOCUMENTS

| JP | S57-5109 A | 1/1982 |
| JP | H05-250444 A | 9/1993 |

(Continued)

OTHER PUBLICATIONS

Jason Kantz, "Application of Sweeping Techniques to Reverse Engineering," MS thesis, Dec. 19, 2003, p. 1-63. (Year: 2003).*

(Continued)

*Primary Examiner* — Sing-Wai Wu
(74) *Attorney, Agent, or Firm* — Polsinelli PC (57) ABSTRACT

A surface generation device includes: a profile curve setting unit 2 configured to set a profile curve fitted to a part of shape data, a profile curve movement unit 3 configured to move the profile curve so as to satisfy a predetermined condition, and a surface generation unit 4 configured to generate a surface defined by a locus obtained by moving the profile curve satisfying the predetermined conditions. The predetermined conditions include a condition in which a locus of one point (for example, midpoint) on the profile curve becomes a line of curvature of the surface to be generated. Using such a condition, it is possible to efficiently obtain the high quality surface by setting the line of curvature indicating a flow of the surface as a guide line of a sweep method without repeating trial and error many times.

21 Claims, 4 Drawing Sheets

(51) Int. Cl.
*G06F 30/10* (2020.01)
*G06F 30/00* (2020.01)

(56) References Cited

U.S. PATENT DOCUMENTS 5,982,490 A * 11/1999 Ichikawa .................. G01J 9/02
356/512
7,236,167 B2 * 6/2007 Lee .......................... G06T 17/30
345/420

FOREIGN PATENT DOCUMENTS

| JP | 2938909 B2 | 8/1999 |
| JP | 2000-011210 A | 1/2000 |
| JP | 2005-149245 A | 6/2005 |
| JP | 2007-156604 A | 6/2007 |

OTHER PUBLICATIONS

Cai-Yun Li, Ren-Hong Wang and Chun-Gang Zhu, "An approach for designing a developable surface through a given line of curvature," Computer-Aided Design 45 (2013), p. 621-627. (Year: 2013).*
Kantz et al., "Application of Sweeping Techniques to Reverse Engineering", Department of Computer and Information Science the University of Michigan-Dearbon, Dec. 19, 2003, (63 pages).
Li et al., "An approach for designing a developable surface through a given line of curvature", Computer-Aided Design 45 (2013), pp. 621-627.
Stamati et al., "Building Editable B-rep Models from Unorganized Point Clouds", Technical Report: Computer Science Department, Noname manuscript No. TR-CS-2010-04, Jul. 7, 2010, pp. 1-10.
Search Report dated Jul. 3, 2020 in corresponding European Patent Application No. 17891292.9 (9 pages).

* cited by examiner

CURVED SURFACE GENERATION DEVICE AND CURVED SURFACE GENERATION PROGRAM

CROSS REFERENCE TO RELATED APPLICATIONS

This application is a National Phase filing under 35 U.S.C. § 371 of PCT/JP2017/042636 filed on Nov. 28, 2017; which application in turn claims priority to Application No. 2017-002602 filed in Japan on Jan. 11, 2017. The entire contents of each application are hereby incorporated by reference.

TECHNICAL FIELD

The present invention relates to a surface generation device and a surface generation program, and more particularly, a surface generation device for generating a surface of a smooth change in curvature desirable in the field of design.

BACKGROUND ART

In general, in order to design a product, computer aided design (CAD) is used to generate shape data of the product. As a method of generating the shape data, a method of reconstructing a surface model of an object using CAD from measurement data of the object as a model is widely employed. For example, in the case of a surface shape of an automobile, CAD data are generated from measurement data of a clay model modeled by a clay modeler using a clay spatula (curve ruler).

In order to reconstruct the surface model from the measurement data using a CAD system, it is required that: (i) the generated surface can sufficiently approximate the measurement data within a specified tolerance, and (ii) the generated surface has a smooth change in curvature. In particular, the requirement (ii) is important for an aesthetic property of the surface in design, and is also very important because it has an aesthetic impact on consumers.

In the case of generation of a surface of an automobile, a surface model using the CAD for the clay model is reconstructed by considering the curve ruler as a profile curve and sweeping the profile curve along a certain flow. If both the profile curve and the flow of the profile curve are correctly expressed, it is possible to generate a high quality surface. However, in particular, it is very difficult to correctly express a curve representing the flow of the profile curve from the measurement data, and it is not easy to generate a high quality surface.

Note that, in the relate art, there are known some techniques of generating a surface by sweeping a profile curve along a curve serving as a guidance in the CAD or the like (for example, see Patent Documents 1 to 3). Although the curve serving as a guidance is called different names depending on documents (such as a control curve, a locus curve, or a feature line), they will be collectively called a "guide line" hereinafter.

In the surface generation device of Patent Document 1, a free surface is generated by rotating and/or enlarging an input curve in a sweep position with a specified rotation amount and a magnification while sweeping the input curve along the guide line in response to an instruction from a coordinate input device. In a three-dimensional surface shape generation device of Patent Document 2, by performing a sweeping process using an interpolation curve and a control vector in addition to the guide line and the profile curve, an accurate swept surface can be generated even when a curvature change of the locus is severe. In a surface generation device of Patent Document 3, on a surface obtained by deforming and/or moving the profile curve along the guide line, a surface that is smoothly connected to a support surface on the guide line and passes through the support curve is generated.

There is also known a surface reproduction device configured to reproduce surface data on the basis of a line of curvature indicating a principal direction of meshes (for example, see Patent Document 4). In the surface reproduction device of Patent Document 4, a surface in a real space is mapped to a parameter space to calculate the first and second fundamental coefficients. Then, a line of curvature of the surface and real space coordinates where the line of curvature passes are calculated, so that real space coordinates of an intersection on the parameter space between a line passing through an inverse mapping target point on the parameter space and a line of curvature mapped to the parameter space are calculated. In addition, a curve on the real space passing through the calculated real space coordinates of the intersection is calculated, and a real space coordinate value of the inverse mapping target point on the curve is calculated on the basis of this curve, so that the surface data on the real space are reproduced.

Patent Document 1: Japan Patent No. 2938909
Patent Document 2: JP-A-5-250444
Patent Document 3: JP-A-2000-11210
Patent Document 4: JP-A-2005-149245

SUMMARY OF THE INVENTION

In general, the sweep-based method is advantageous in that a control point can be intentionally regularly arranged. However, there is a problem that it is difficult to correctly specify the guide line necessary for sweeping the profile curve from the measurement data. Since the quality of the surface generated on the basis of the sweep method largely depends on the quality of the guide line to be specified, it is very important to appropriately express the guide line. However, a method of calculating an appropriate guide line has not be established, so that a CAD modeler is necessary to repeatedly adjust the guide line through trial and error until the quality of the generated surface is secured. This necessitates a lot of time and effort.

In view of the aforementioned problems, an object of the invention is to effectively generate a high quality surface without repeating trial and error many times.

In order to address the aforementioned problems, according to the invention, a profile curve fitted to a part of shape data of a model is set, the profile curve is translated and rotated to satisfy a predetermined condition, and a surface is generated by interpolation from boundary curves of the surface defined by a locus of the moved profile curve. Here, the predetermined condition is a condition in which a locus formed by one point (for example, midpoint) on the profile curve becomes a line of curvature of a surface to be generated.

Using the aforementioned processing according to the invention, in a case where the shape data of the model and the profile curve are set, and the guide line necessary to sweep the profile curve is unknown, a surface corresponding to that obtained by sweeping the set profile curve along the locus of one point on the profile curve corresponding to the guide line is generated. Since the locus corresponding to the guide line is given as a line of curvature indicating a flow of the surface, it is possible to efficiently generate the high quality surface without repeating trial and error many times by setting the line of curvature indicating the flow of the surface as a guide line of a sweep method.

MODE FOR CARRYING OUT THE INVENTION

First Embodiment

Figure 1:
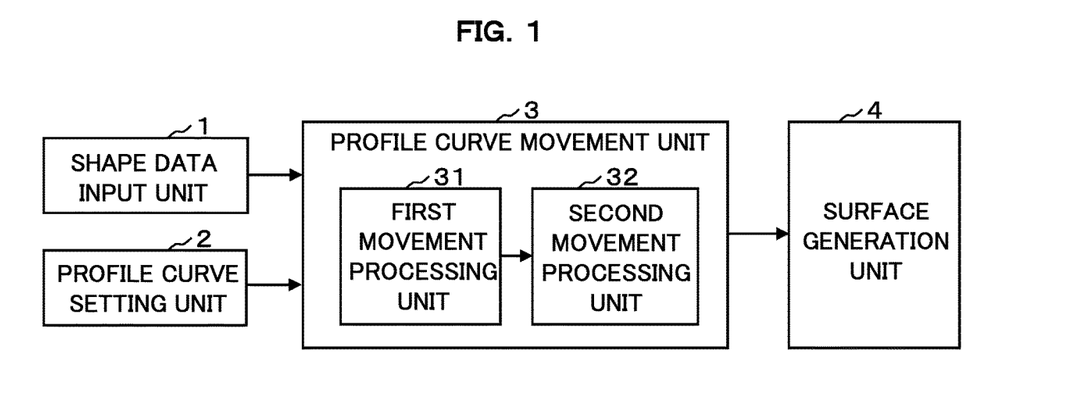
FIG. 1 is a block diagram illustrating an exemplary functional configuration of a surface generation device according to a first embodiment.

A first embodiment of the invention will now be described with reference to the accompanying drawings. FIG. 1 is a block diagram illustrating an exemplary functional configuration of a surface generation device according to the first embodiment. As illustrated in FIG. 1, a functional configuration of the surface generation device according to the first embodiment includes a shape data input unit 1, a profile curve setting unit 2, a profile curve movement unit 3, and a surface generation unit 4. The profile curve movement unit 3 has a first movement processing unit 31 and a second movement processing unit 32.

Each functional block 1 to 4 described above may be configured by any one of hardware, a digital signal processor (DSP), and software. For example, in the case of software, each functional block 1 to 4 described above includes a central processing unit (CPU), a random access memory (RAM), a read-only memory (ROM), or the like of a computer in practice, and is implemented by operating a program stored in a recording medium such as a RAM, a ROM, a hard disk, or a semiconductor memory.

The shape data input unit 1 inputs shape data of a model. In the first embodiment, the shape data input unit 1 inputs measurement data (point cloud data or polygonal data) regarding a shape of a clay model or the like.

Figure 2:
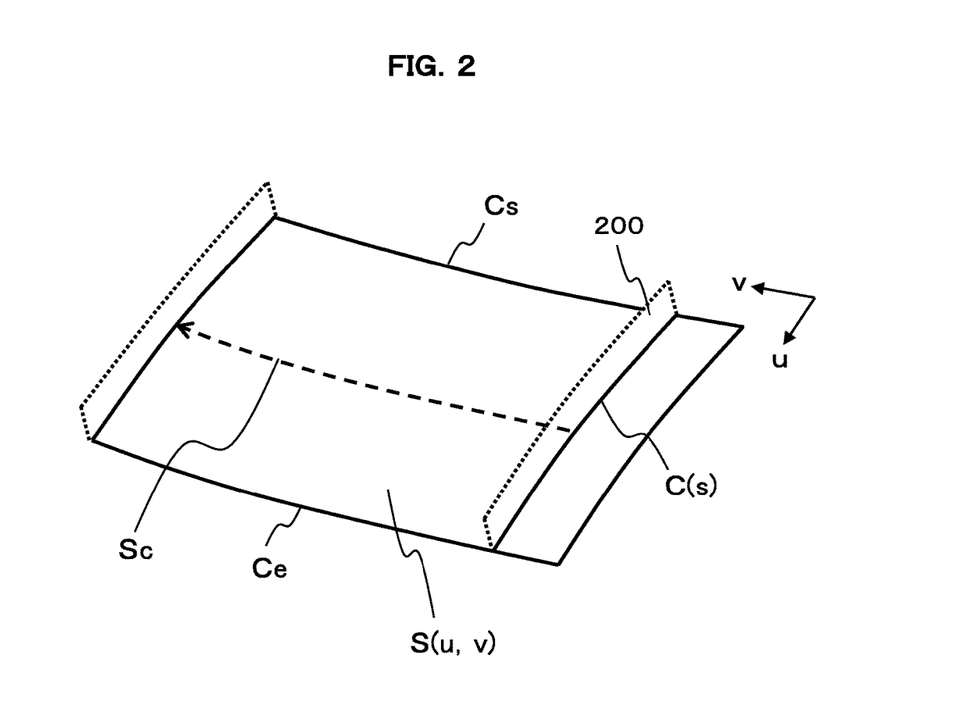
FIG. 2 is a diagram illustrating an outline of a process of the surface generation device according to the first embodiment.

The profile curve setting unit 2 sets a profile curve fitted to a part of the shape data input by the shape data input unit 1. The profile curve set here is generated by emulating a curve ruler used by a designer (clay modeler) to generate a clay model of an automobile. FIG. 2 is a diagram illustrating an outline of the processing of the surface generation device according to the first embodiment. In FIG. 2, an exemplary profile curve C(s) set by emulating a curve ruler 200 using the profile curve setting unit 2 is illustrated.

In the first embodiment, an objective surface (hereinafter, referred to as a "target surface") S(u, v) is generated by moving the profile curve C(s) fitted to a part of the shape data using the profile curve setting unit 2 as described below and performing interpolation from a boundary curves defined from the trajectories of endpoints of the profile curve C(s) formed by the movement.

In the first embodiment, the target surface S(u, v) is represented by a B-spline surface. As illustrated in FIG. 2, a shape of the target surface S(u, v) in a u-direction can be perfectly characterized by the profile curve C(s) set by the profile curve setting unit 2. In addition, two boundary curves Cs and Ce for a v-direction of the target surface S (u, v) are defined as loci (or trajectories)obtained by moving both end points of the profile curve C(s).

The profile curve movement unit 3 performs a process for moving the profile curve C(s) initially set by the profile curve setting unit 2 to satisfy a predetermined condition. In the first embodiment, the profile curve C (s) is moved by the first and second movement processing units 31 and 32. In this case, the first movement processing unit 31 performs only translation, and the second movement processing unit 32 performs both translation and rotation. This processing will be described below in details.

The first movement processing unit 31 translates the profile curve C(s) initially set by the profile curve setting unit 2 so as to minimize an error from the shape data input by the shape data input unit 1, and obtains, at every predetermined interval, a tangent vector indicating a direction of a locus of translation of one point on the profile curve C(s). The one point on the profile curve C(s) is, for example, a midpoint of the profile curve C(s), but not limited thereto. The predetermined interval may be a fixed value set by the surface generation device in advance, or may be a variable value that can be designated by a user.

Figure 3:
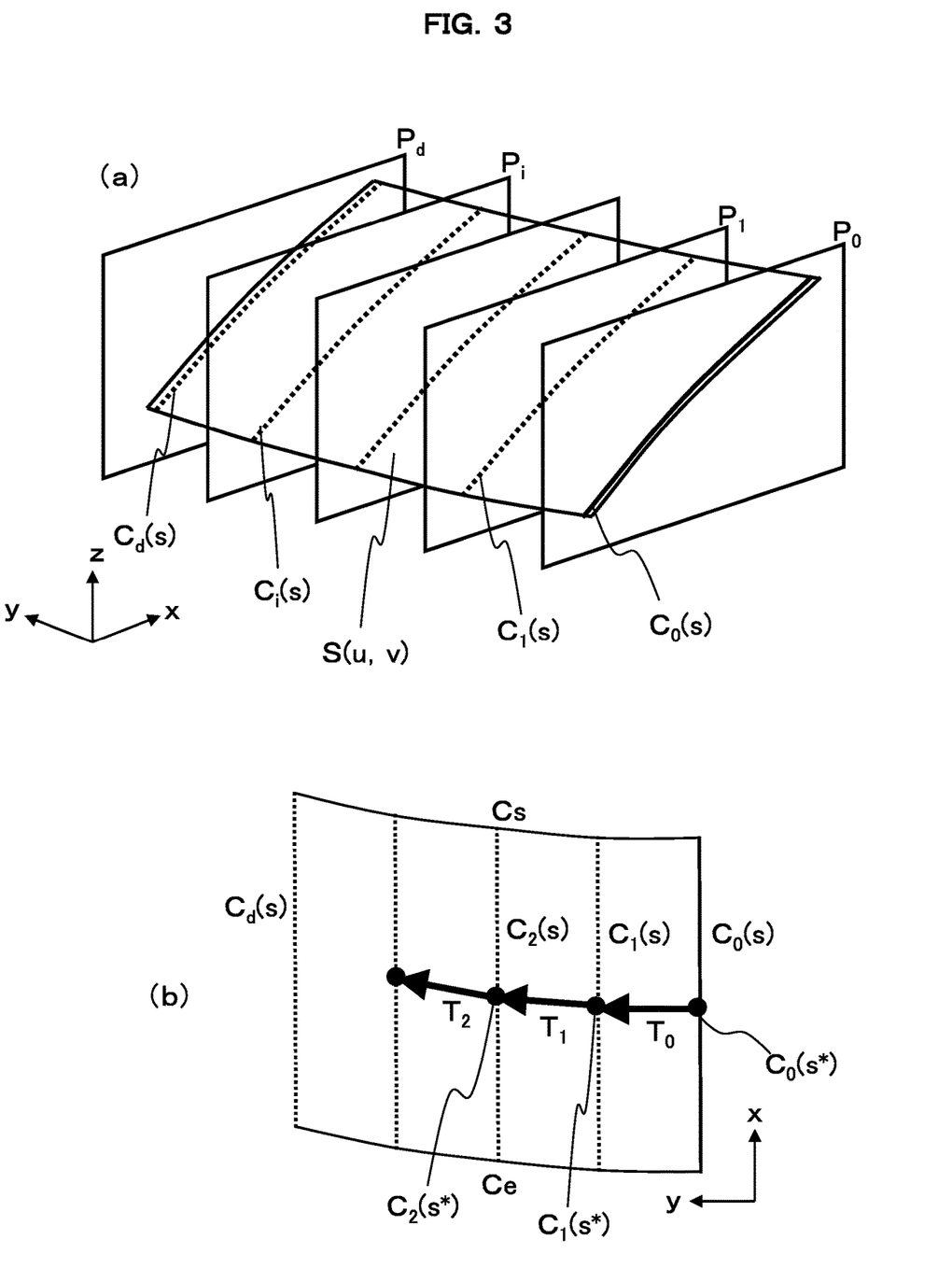
FIG. 3 is a diagram illustrating a processing content of a first movement processing unit according to the first embodiment.

FIG. 3 is a diagram for describing a processing content of the first movement processing unit 31. An exemplary processing of the first movement processing unit 31 will now be described in details with reference to FIG. 3. That is, the first movement processing unit 31 translates the profile curve C(s) set to be fitted to a part of the shape data by the profile curve setting unit 2 in the following sequence.

First, the initially set profile curve C(s) is set as "$C_0(s)$", and the profile curve $C_0(s)$ is translated at predetermined intervals in a direction of a normal vector $T_0^\sim$ (not shown in FIG. 3) of a plane $P_0$ including the profile curve $C_0(s)$, so that the obtained moved profile curve C(s) is set as $C_1(s)^\sim$ (not shown in FIG. 3). Note that, if the profile curve $C_0(s)$ is simply translated in the direction of the normal vector $T_0^\sim$, the moved profile curve $C_1(s)^\sim$ may deviate from the shape data to generate an error. Therefore, the first movement processing unit 31 translates the profile curve $C_0(s)$ in the direction of the normal vector $T_0^\sim$ and then translates the profile curve $C_1(s)^\sim$ within a plane $P_1$ including the moved profile curve $C_1(s)$ to obtain "$C_1(s)$", so as to minimize an error between the profile curve $C_1(s)$ and the shape data.

Then, the moved profile curve C(s) obtained by translating the profile curve $C_1(s)$ at predetermined intervals in the direction of a normal vector $T_1^\sim$ (not shown in FIG. 3) of the plane $P_1$ including the moved profile curve $C_1(s)$ is set as "$C_2(s)^\sim$" (not shown in FIG. 3). In addition, the first movement processing unit 31 translates the profile curve $C_2(s)$ within a plane $P_2$ including the moved profile curve $C_2(s)^\sim$ to obtain "$C_2(s)$", so as to minimize an error between the profile curve $C_2(s)$ and the shape data.

This processing is executed repeatedly. In the example of FIG. 3, this processing is performed "d" times. As a result, the first movement processing unit 31 obtains a plurality of profile curves $C_i(s)$ (where i=0 to d) existing at every predetermined interval, planes $P_i$(where i=0 to d) including each profile curve $C_i(s)$, and a plurality of tangent vectors $T_i$ (where i=0 to d) for the movement directions of the profile curves $C_i(s)$.

As described above, for all of "i" (where i=0 to d), if the profile curves $C_i(s)^\sim$ are simply translated in the same direction of the normal vector $T_0^\sim$ (in the case of $T_i=T_0^\sim$, where i=0 to d), the profile curve $C_i(s)^\sim$ may be separated from the shape data, and the error may increase as the translation is repeated (as "i" increases).

In this regard, the first movement processing unit 31 translates the profile curve $C_i(s)$ in the direction of the normal vector of the plane $P_i$ (where i=0 to d) and then further translates the translated profile curve $C_{i+1}(S)^\sim$ within the plane $P_{i+1}$, so as to minimize the error between the profile curve $C_{i+1}(s)$ and the shape data.

As a result, as illustrated in FIG. 3 (b), it is difficult to say that "$T_i=T_0^\sim$ (where i=0 to d)" at all times, so as to obtain a tangent vector $T_i$ (where i=0 to d) satisfying a condition in which each profile curve $C_i(s)$ is best fitted to the shape data. The tangent vector $T_i$ obtained for each predetermined interval in this manner corresponds to a vector indicating a direction of the locus obtained by translating one point on the profile curve $C_i(s)$.

The second movement processing unit 32 sets the tangent vector $T_i$ (where i=0 to d) calculated by the first movement processing unit 31 as an initial vector and further moves the profile curve $C_i(s)$ obtained at every predetermined interval through translation and rotation such that satisfies a predetermined condition. Here, the second movement processing unit 32 updates the tangent vector $T_i$ when translating the profile curve Ct(s) and performs rotation on the basis of the updated tangent vector $T_1$.

In the first embodiment, as the predetermined condition, the following two conditions are established. That is, a first condition (corresponding to a first condition in the claims) is a condition for causing a locus formed by one point on a profile curve $C_i(s)'$ for every predetermined interval moved by the second movement processing unit 32 (corresponding to a guide line if the profile curve C(s) were swept. Hereinafter, referred to as a "pseudo guide line Sc" (see FIG. 2)) to approach a line of curvature having a small torsion. A second condition (corresponding to a third condition in the claims) is a condition for minimizing an error between the target surface S(u, v) to be generated by the surface generation unit 4 and the surface expressed by the shape data input by the shape data input unit 1.

With regard to details of the processing performed by the second movement processing unit 32, first, the rotation of the profile curve $C_i(s)$ will be described. The second movement processing unit 32 rotates the profile curve $C_i(s)$ about a point $C_i(s^*)$ on the profile curve $C_i(s)$ such that the tangent vector $T_{i-1}$ matches the next tangent vector $T_i$. Note that the parameter s* is a value for giving one point (for example, midpoint) on the profile curve $C_i(s)$.

Here, a rotation axis $A^{(i)}$ and a rotation angle θ of the profile curve $C_i(s)$ are set to "$A^{(i)}=T_{i-1}\times T_i$" and "θ=cos$^{-1}$ $(T_{i-1} \cdot T_i)$", respectively. The equation "$A^{(i)}=T_{i-1}\times T_i$" means that an outer product between the tangent vector $T_{i-1}$ and the next tangent vector $T_i$ is set as the rotation axis $A^{(i)}$. Therefore, since the rotation axis $A^{(i)}$ indicates a direction perpendicular to both the tangent vectors $T_{i-1}$ and $T_i$, no rotation occurs in the direction of the tangent vector $T_i$.

In this case, a rotation matrix R is given as the following (Formula 1). Note that l=$A_x^{(i)}$, m=$A_y^{(i)}$, and n=$A_z^{(i)}$. If θ=0, $A^{(i)}$ becomes a zero vector. However, since "R" is subjected to identical transformation (unit matrix), there is no problem in application of this transformation.

[Equation 1]

$$R = \cos\beta \begin{bmatrix} 1 & 0 & 0 \\ 0 & 1 & 0 \\ 0 & 0 & 1 \end{bmatrix} + \qquad \text{(Formula 1)}$$

$$(1-\cos\theta)\begin{bmatrix} l^2 & lm & ln \\ lm & m^2 & mn \\ ln & mn & n^2 \end{bmatrix} + \sin\theta \begin{bmatrix} 0 & n & -m \\ -n & 0 & l \\ n & -l & 0 \end{bmatrix}$$

The rotation matrix R of the aforementioned (Formula 1) can be considered as approximating a rotation minimizing frame (RMF) without rotation in the direction of the tangent vector $T_i$. This is because an arbitrary rotation having a rotation axis A in the direction perpendicular to the tangent vector T in a certain curve is expressed "A·T=0", which is the definition of RMF. With regard to the rotation $A^{(i)}$ in this embodiment, in a case where the tangent vector of the pseudo guide line Sc assumed can be sufficiently approximated by $T_i$ by reducing an interval between the tangent vectors $T_{i-1}$ and $T_i$, the matrix R means the rotation by the RMF.

Figure 4:
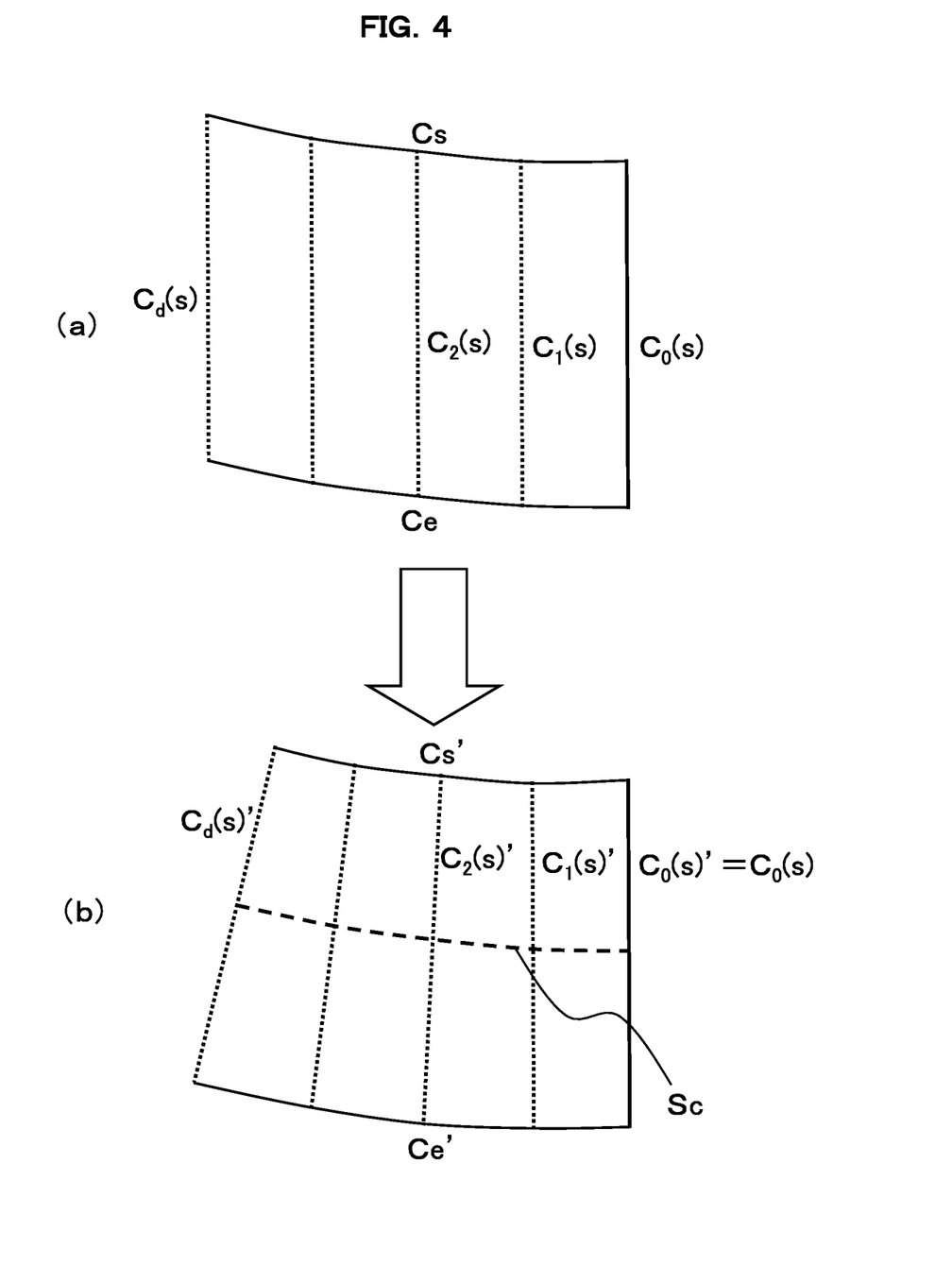
FIG. 4 is a schematic diagram illustrating an exemplary movement of a profile curve executed by a second movement processing unit according to the first embodiment.

FIG. 4 is a schematic diagram illustrating an exemplary movement (including translation and rotation) of the profile curve $C_i(s)$ executed by the second movement processing unit 32. FIG. 4(a) illustrates a result of translation of the profile curve $C_i(s)$ by the first movement processing unit 31 (in the same state as that of FIG. 3(b)). In comparison, FIG. 4(b) illustrates a result of further translation and rotation of the profile curve $C_i(s)$ of FIG. 4(a). The profile curve $C_1(s)'$ of FIG. 4(b) indicates a result of movement performed by satisfying the aforementioned two conditions (corresponding to the first and third conditions of the claims).

Next, the first condition (first condition) will be described. Here, in order to associate the action of the clay modeler for moving the curve ruler 200 smoothly with the characteristic of the target surface S(u, v), the following two conditions are assumed.

P1) The pseudo guide line Sc means an intentional flow on the target surface S(u, v) to be generated, and the flow is specified as a line of curvature. The line of curvature indicates a flow of the surface with respect to the principal direction against the minimum principal curvature on the target surface S(u, v).

P2) The pseudo guide line Sc has a small torsion.

The condition P1 is a condition in which the pseudo guide line Sc as a locus formed by connecting one point $C_i(s^*)'$ on the profile curve $C_i(s)'$ at every predetermined interval moved on the basis of the translation and the rotation becomes a line of curvature of the target surface S (u, v) to be generated by the surface generation unit 4.

The condition P2 is a condition in which the angle from the normal vector of the target surface S(u, v) to be generated by the surface generation unit 4 to the principal normal vector of the pseudo guide line Sc becomes constant on the locus of the pseudo guide line Sc.

Note that the surface generation unit 4 generates a surface by interpolation from boundary curves defined by the loci (or trajectories) of the endpoints of the profile curve C(s)' moved by the profile curve movement unit 3. That is, in FIG. 4 (b), the surface generation unit 4 generates the target surface S (u, v) by interpolation from the four sides using two profile curves $C_0(s)'$ and $C_d(s)'$ for the u-direction at the start point and the end point of the movement and two boundary curves Cs' and Ce' for the v-direction, for example, on the basis of the Coons patch known in the art.

The second movement processing unit 32 performs a process of causing the pseudo guide line Sc to approach the line of curvature in order to satisfy the condition P1. Here, the line of curvature is given in the following (Formula 2).

$$(EM-FL)du^2+(EN-GL)dudv+(FN-GM)dv^2=0 \quad \text{(Formula 2)}$$

Here, "E", "F", and "G" are coefficients of the first fundamental form (first fundamental magnitude) of the surface, and "L", "M", and "N" are coefficients of the second fundamental form (second fundamental magnitude) of the surface. Since the pseudo guide line Sc is an isoparametric curve "S(u*, v)(C (s*)=S (u*, 0))" in the v-direction on the target surface S(u, v) corresponding to the locus of one point C(s*) of the profile curve, the condition P1 can be expressed as the following (Formula 3) by setting "du=0". In this (Formula 3), "$V_N$" denotes a normal vector of the target surface S(u, v).

[Equation 2]

$$\psi(u^*, v) = FN - GM \quad \text{(Formula 3)}$$
$$= S_u(u^*, v_i) \cdot S_v(u^*, v_i) V_N(u^*, v_i) \cdot$$
$$S_{vv}(u^*, v_i) - |S_v(u^*, v_i)|^2 V_N(u^*, v_i) \cdot$$
$$S_{uv}(u^*, v_i)$$
$$= 0$$

Next, the condition P2 will be described. A geodesic torsion $T_g$ of a certain curve C on the surface is given by the following (Formula 4).

$$\tau_g=(d\alpha/ds)-\tau \quad \text{(Formula 4)}$$

Here, "τ" denotes a ordinary torsion of the curve C, and "α" denotes the angle from the normal vector $V_N$ of the surface to the principal normal vector of the curve C. In addition, "$\tau_g$=0" on lines of curvature. Therefore, the pseudo guide line Sc becomes a curve having a small torsion t by reducing the "dα/ds" as small as possible in order to satisfy the condition P2.

In the aforementioned description, for the first condition, the pseudo guide line Sc becomes the line of curvature on the target surface S(u, v), and the pseudo guide line Sc has the small torsion τ. This is evaluated by the function ψ of the following (Formula 5). Here, "$w_1$" and "$w_2$" denote weighting coefficients. In addition, "$N_2$" denotes the number of the sampling points on the pseudo guide line Sc. These sampling points are preferably extracted uniformly from the pseudo guide line Sc.

[Equation 3]

$$\Psi = w_1 \sum_{i=0}^{N_2} [\psi(u^*, v_i)]^2 + w_2 \sum_{i=1}^{N_2} |\alpha_i - \alpha_{i-1}|^2 \quad \text{(Formula 5)}$$

Next, a second condition (third condition) will be described. The third condition is a condition for minimizing an error between the target surface S(u, v) to be generated by the surface generation unit 4 and the surface expressed by the shape data input by the shape data input unit 1.

For the third condition, whether or not an error between the target surface S(u, v) and each sampling point $Q_i$ on the shape data is small is evaluated on the basis of the following (Formula 6). Here, "N" denotes the number of the sampling points $Q_i$ extracted from the shape data. Note that the sampling points $Q_1$ is preferably extracted from whole of the shape data uniformly and is appropriately extracted so as to extend over the entire surface.

[Equation 4]

$$\sum_{i=1}^{N} (S(u, v) - Q_i)^2 \quad \text{(Formula 6)}$$

Considering the first and third conditions described above, the second movement processing unit 32 moves the profile curve C (s) to minimize the objective function J as defined in the following (Formula 7).

[Equation 5]

$$J = \sum_{i=1}^{N} (S(u, v) - Q_i)^2 + \Psi \quad \text{(Formula 7)}$$

As described above in details, if the processing of the first embodiment is executed by inputting the shape data of a clay model or the like and the profile curve C (s) fitted to the shape data, the locus (pseudo guide line Sc) defined by the locus of one point on the profile curve C (s) by moving the profile curve C(s) in order to generate the target surface S (u, v) can be expressed as a line of curvature indicating a flow of the surface of the principal direction with respect to the minimum principal curvature on the target surface S(u, v) to be generated from the model shape.

That is, according to the first embodiment, unlike the sweep method of the related art which requires the guide line to be given in advance as input data, if the shape data and the profile curve C(s) are given, the locus of the point C(s*) caused by the movement of the curve C(s) becomes the line of curvature of the target surface S(u, v) to be generated, and the target surface S (u, v) is generated such that the torsion is small. That is, it is possible to efficiently generate an excellent target surface S (u, v) in which the pseudo guide line Sc becomes a line of curvature having a small torsion without repeating trial and error many times.

Note that, in the first embodiment, only the condition P1 in which the pseudo guide line Sc becomes the line of curvature of the target surface S (u, v) may be used as the first condition by setting the weighting factor $w_2$ of (Formula 5) to zero. Even when only the condition P1 is employed, it is possible to avoid the torsion of the pseudo guide line Sc from increasing explicitly because the profile curve C(s) moves by the rotation that approximates the RMF.

Although, in the first embodiment, an example of generating a target surface S (u, v) from the measurement data of a clay model or the like of an automobile has been described, the shape data used as the input data is not limited to the measurement data of the clay model. For example, the target surface S(u, v) may be generated from measurement data of a commercial vehicle. In addition, the shape data is not limited to the measurement data, but may be CAD data or discrete approximation thereof. Furthermore, the target model is not limited to the automobile, but may include all types of articles.

Although, in the first embodiment, an example in which the positions of each profile curve $C_i(s)$ are adjusted to satisfy the first condition for making the pseudo guide line Sc the line of curvature having a small torsion and the third condition for minimizing the error between the target surface S(u, v) to be generated and the shape data of a clay model or the like has been described, the weights on both conditions may be adjusted by setting weighting coefficients in the first term representing the third condition and the second term representing the first condition in Formula (7). For example, in a case where, as the input data, CAD data representing a design concept to be generated anew instead of the measurement data for a real model is input from the shape data input unit 1 to generate the target surface S(u, v), or the like, the processing may be performed by reducing the weight of the third condition.

Second Embodiment

Figure 5:
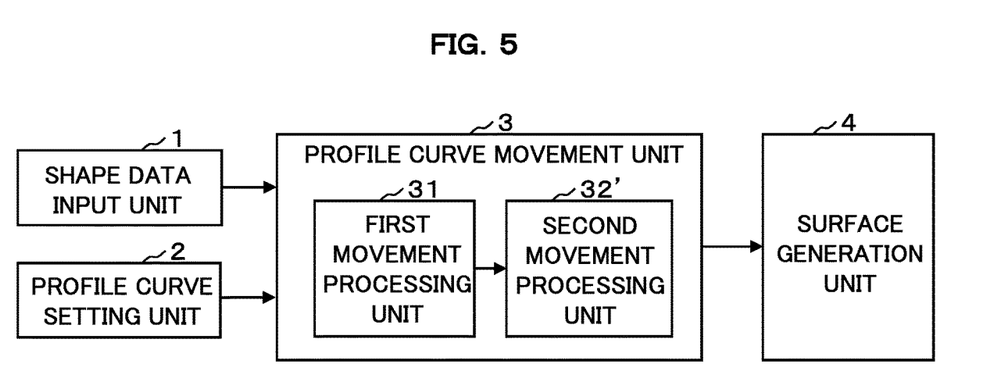
FIG. 5 is a block diagram illustrating an exemplary functional configuration of a surface generation device according to a second embodiment.

Next, a second embodiment according to the invention will be described with reference to the accompanying drawings. FIG. 5 is a block diagram illustrating an exemplary functional configuration of a surface generation device according to the second embodiment. Note that, in FIG. 5, like reference numerals denote like elements as in FIG. 1, and they will not be described here repeatedly. The surface generation device according to the second embodiment has a second movement processing unit 32' instead of the second movement processing unit 32.

In the first embodiment described above, an example in which the positions of each profile curve $C_i(s)'$ are adjusted to satisfy the first condition such that the locus of the point $C_i(s^*)'$ on each profile curve $C_i(s)'$ formed by moving the profile curve C(s) becomes a line of curvature having a small torsion on the target surface S(u, v) in order to improve the quality of the target surface S(u, v) to be reconstructed from the shape data (measurement data of a clay model or the like) has been described.

In addition, in the second embodiment, the positions of each profile curve $C_i(s)$ are adjusted by imposing a second condition to the boundary curves Cs and Ce in the v-direction of the target surface S(u, v). The second condition is a condition in which the boundary curves Cs' and Ce' have curvature monotonicity.

That is, in the translation of the profile curve C(s) performed by the first movement processing unit 31 and the translation and rotation of the profile curve C(s) performed by the second movement processing unit 32, the two boundary curves Cs and Ce defining the v-direction of the surface S(u, v) generated accordingly are obtained just by interpolation or approximation for both end points of a plurality of profile curves $C_i(s)$ (where i=0 to d), and it is not guaranteed that the curvature monotonicity desired in the design is satisfied. Therefore, an optimum tangent vector $T_i$ is calculated by minutely adjusting each profile curve $C_i(s)$ within the plane $P_i$ such that both the boundary curves Cs and Ce have curvature monotonicity.

In a case where the curvatures of the two boundary curves Cs (=S(0, v)) and Ce (=S(1, v)) in the v-direction of the surface S(u, v) monotonically increase, the function φ expressed in the following (Formula 8) is introduced for evaluation. Here, "$\kappa_i$" denotes a curvature in each sampling point set at equal intervals on each of the boundary curves Cs and Ce, and $\delta(\kappa_i)$ denotes a penalty function defined in (Formula 9). The first term of (Formula 8) defines curvature monotonicity for the boundary curve Cs, and the second term defines curvature monotonicity for the other boundary curve Ce. "$N_1$" denote the number of the sampling points.

[Equation 6]

$$\Phi = \sum_{i=1}^{N_1} \delta(K_i) + \sum_{i=1}^{N_1} \delta(K_i) \quad \text{(Formula 8)}$$

$$\delta(K_i) = \begin{cases} 0 & \text{if } \kappa_i - \kappa_{i-1} > 0 \\ |\kappa_i - \kappa_{i-1}| & \text{for other cases} \end{cases} \quad \text{(Formula 9)}$$

In the second embodiment, the second movement processing unit 32' moves the profile curve C(s) such that the objective function J defined in (Formula 10) instead of (Formula 7) is minimized. Here, "$\epsilon_1$" and "$\epsilon_2$" are weighting factors.

[Equation 7]

$$J = \sum_{i=1}^{N} (S(u, v) - Q_i)^2 + \epsilon_1 \Phi + \epsilon_2 \Psi \quad \text{(Formula 10)}$$

According to the second embodiment configured as described above, the locus of one point $C_i(s^*)'$ (for example, midpoint) on the profile curve $C_i(s)'$ becomes a desirable curve (a line of curvature having a small torsion) as the pseudo guide line Sc, and each boundary curve Cs' and Ce' formed by the locus of both end points of the profile curve Ci(s)' becomes a curve having curvature monotonicity. Since each boundary curve Cs' and Ce' has curvature monotonicity, the pseudo guide line Sc also has curvature monotonicity. For this reason, it is possible to further improve the quality of the target surface S(u, v) reconstructed from the shape data.

Note that, even in the second embodiment, similar to the first embodiment, only the condition P1 may be used as the first condition by setting the weighting coefficient $w_2$ of (Formula 5) to zero. In addition, the shape data serving as the input data is not limited to measurement data of a clay model or the like, but may include CAD data or discrete approximation thereof. Furthermore, in (Formula 10), the weighting factor may also be set for the first term indicating the third condition.

Although, in the first and second embodiments, an example in which the target surface S(u, v) to be generated by the surface generation unit 4 is expressed on a B-spline surface has been described, the invention is not limited thereto. For example, the target surface S(u, v) may also be expressed on the Bézier surface.

Although, in the first and second embodiments, an example in which the profile curve C(s) is set by emulating the curve ruler 200 used to generate a clay model has been described, the invention is not limited thereto. That is, the profile curve C(s) may be set to match the shape of the target surface S(u, v) to be generated.

Although, in the first and second embodiments, an example in which the movement of the profile curve C(s) is performed in two stages dividingly into the first and second movement processing units 31 and 32 has been described, the invention is not limited thereto. That is, the movement of the profile curve C(s) may be performed in a single stage by rotating the profile curve C(s) while translating it at predetermined intervals.

Although, in the first and second embodiments, the rotation of the profile curve C(s) is defined in (Formula 1), the expression is not limited to the (Formula 1). That is, there are several other alternative expressions that approximate the RMF. In addition, the (Formula 1) may also cope with rotation around any axis depending on the setting of the rotation axis $A^{(i)}$.

Although, in the first and second embodiments, the target surface S (u, v) is generated by interpolation from the boundary curves by using the Coons patch, the invention is not limited thereto. For example, all of the aforementioned discussions may be applicable even by approximating the locus of one point C(s*) (for example, midpoint) on the profile curve C(s) using the B-spline curve or the like and sweeping the profile curve C(s) along the approximated curve.

Although, in the first and second embodiments, an example in which, for the processing of the first movement processing unit 31, the profile curve $C_i(s)$ is translated in the direction of the normal vector of the plane $P_i$, and the translated profile curve $C_{i+1}(s)^\sim$ is further translated within the plane $P_{i+1}$ has been described, the translation may be performed only for the normal vector direction. In this case, the tangent vector $T_i$ that minimizes the error between the profile curve $C_{i+1}$ (s) and the shape data is not generated as an initial vector. However, through optimization computation using the second movement processing unit 32, the target surface S(u, v) satisfying the first to third conditions can be generated. Note that, since the first movement processing unit 31 generates the tangent vector $T_i$ that minimizes the error between the profile curve $C_{i+1}(s)$ and the shape data as an initial vector, it is possible to shorten a processing time for optimization computation of the second movement processing unit 32 advantageously.

Any one of the first and second embodiments is just illustrative purposes for specifying the best modes of the invention, and they are not to be construed as a limitative sense in the technical scope of the invention. That is, the invention may be embodied in various manners without departing from the gist and scope thereof.

REFERENCE SIGNS LIST

1 Shape data input unit
2 Profile curve setting unit
3 Profile curve movement unit
4 Surface generation unit
31 First movement processing unit
32, 32' Second movement processing unit

The invention claimed is:
1. A surface generation device comprising:
a shape data input unit configured to input shape data of a model;
a profile curve setting unit configured to set, into a computer, profile curve fitted to a part of the shape data;
a profile curve movement unit configured to perform a sweeping process by translating and rotating the profile curve set by the profile curve setting unit, and to decide a pseudo guide line satisfying a predetermined condition; and
a surface generation unit configured to generate surface data defined by a locus obtained by adjusting the profile curve using the sweeping process of the profile curve movement unit,
wherein the predetermined condition includes a first condition, relating to a shape feature of a surface, in which a pseudo guide line expressed as the locus of one point on the profile curve moved-by the sweeping process of the profile curve movement unit becomes a line of curvature of the surface data to be generated, and the pseudo guide line has a small torsion.

2. The surface generation device according to claim 1, wherein the predetermined condition further includes a second condition, relating to a shape feature of a boundary curve of the surface data, in which two pieces of curves formed by moving both ends of the profile curve for moving the profile curve using the sweeping process have curvature monotonicity.

3. The surface generation device according to claim 1, wherein the predetermined condition further includes a third condition, relating to fitting accuracy of surface data, in which an error between the surface data to be generated and the shape data input by the shape data input unit is minimized.

4. A surface generation device comprising:
shape data input unit configured to input shape data of a model;
a profile curve setting unit configured to set, into a computer, profile curve fitted to a part of the shape data;
a profile curve movement unit configured to perform a sweeping process by translating and rotating the profile curve set by the profile curve setting unit, and to decide a pseudo guide line satisfying a predetermined condition; and
a surface generation unit configured to generate surface data defined by a locus obtained by adjusting the profile curve using the sweeping process of the profile curve movement unit,
wherein the predetermined condition includes a first condition, relating to a shape feature of a surface, that is a condition for matching the pseudo guide line expressed as a locus of one point on the profile curve moved by the sweeping process of the profile curve movement unit with a flow of surface data to be generated, and in which the pseudo guide line becomes a line of curvature of the surface data;
wherein the profile curve movement unit has
a first movement processing unit configured to obtain, at every predetermined interval, a tangent vector indicating a direction of the locus obtained by translating one point on the profile curve by performing a first movement process for translating the profile curve set by the profile curve setting unit, and
a second movement processing unit configured further move the profile curve obtained at every predetermined interval through translating and rotating the profile curve so as to satisfy the predetermined condition by setting each of the tangent vectors obtained at every predetermined interval by the first movement process of the first movement processing unit as an initial vector; and
wherein the second movement processing unit moves the profile curve the profile curve by rotation using a rotation minimizing frame without rotation in a direction of the tangent vector by rotating the profile curve about one point on the profile curve such that the tangent vector indicating a direction of next translation of the profile curve matches a tangent vector indicating a direction of translation of the profile curve before the predetermined interval.

5. The surface generation device according to claim 4, wherein the first movement processing unit translates the profile curve so as to minimize an error from the shape data by repeating, at every predetermined interval, a process of translating the profile curve by the predetermined interval in a direction of a normal vector of a plane including the profile curve, and then further translating the profile curve after the translation in a plane including the profile curve after the translation.

6. The surface generation device according to claim 4, wherein the predetermined condition further includes a second condition, relating to a shape feature of a boundary curve of the surface data, in which two pieces of curves formed by moving both ends of the profile curve for moving the profile curve using the sweeping process have curvature monotonicity.

7. The surface generation device according to claim 4, wherein the predetermined condition further includes a third condition, relating to fitting accuracy of surface data, in which an error between the surface data to be generated and the shape data input by the shape data input unit is minimized.

8. A non-transitory computer readable medium storing a surface generation program that, when executed by a system including electronic computer hardware, cause the system to perform operations comprising:
inputting shape data of a model;
setting a profile curve fitted to a part of the shape data;
applying a sweep process by translating and rotating the profile curve and decide a pseudo guide line satisfying a predetermined condition; and
generating surface data defined by a locus obtained by adjusting the profile curve using the sweep process,
wherein the predetermined condition includes a first condition, relating to a shape feature of a surface, in which a pseudo guide line expressed as the locus of one point on the profile curve moved by the sweeping process becomes a line of curvature of the surface data to be generated, and the pseudo guide line has a small torsion.

9. The non-transitory computer readable medium according to claim 8, wherein the sweeping process moves the profile curve by rotation using a rotation minimizing frame.

10. The non-transitory computer readable medium according to claim 9, wherein the predetermined condition further includes a second condition, relating to a shape feature of a boundary curve of the surface data, in which two pieces of curves formed by moving both ends of the profile curve for moving the profile curve using the sweeping process have curvature monotonicity.

11. The non-transitory computer readable medium according to claim 9, wherein the predetermined condition further includes a third condition, relating to fitting accuracy of surface data, in which an error between the surface data is minimized.

12. The non-transitory computer readable medium according to claim 8, wherein the predetermined condition further includes a second condition, relating to a shape feature of a boundary curve of the surface data, in which two pieces of curves formed by moving both ends of the profile curve for moving the profile curve using the sweeping process have curvature monotonicity.

13. The non-transitory computer readable medium according to claim 8, wherein the predetermined condition further includes a third condition, relating to fitting accuracy of surface data, in which an error between the surface data to be generated is minimized.

14. A method, comprising:
inputting shape data of a model;
setting a profile curve fitted to a part of the shape data;
applying a sweep process by translating and rotating the profile curve and decide a pseudo guide line satisfying a predetermined condition; and
generating surface data defined by a locus obtained by adjusting the profile curve using the sweep process,
wherein the predetermined condition includes a first condition, relating to a shape feature of a surface, in which a pseudo guide line expressed as the locus of one point on the profile curve moved-by the sweeping process becomes a line of curvature of the surface data to be generated, and the pseudo guide line has a small torsion.

15. The method according to claim 14, wherein the sweeping process moves the profile curve by rotation using a rotation minimizing frame.

16. The method according to claim 15, wherein the predetermined condition further includes a second condition, relating to a shape feature of a boundary curve of the surface data, in which two pieces of curves formed by moving both ends of the profile curve for moving the profile curve using the sweeping process have curvature monotonicity.

17. The method according to claim 15, wherein the predetermined condition further includes a third condition, relating to fitting accuracy of surface data, in which an error between the surface data is minimized.

18. The method according to claim 14, wherein the predetermined condition further includes a second condition, relating to a shape feature of a boundary curve of the surface data, in which two pieces of curves formed by moving both ends of the profile curve for moving the profile curve using the sweeping process have curvature monotonicity.

19. The method according to claim 14, wherein the predetermined condition further includes a third condition, relating to fitting accuracy of surface data, in which an error between the surface data to be generated is minimized.

20. A non-transitory computer readable medium storing a surface generation program that, when executed by a system including electronic computer hardware, cause the system to perform operations comprising:
inputting shape data of a model;
setter a profile curve fitted to a part of the shape data;
applying a sweep process by translating and rotating the profile curve and decide a pseudo guide line satisfying a predetermined condition; and
generating surface data defined by a locus obtained by adjusting the profile curve using the sweep process,
wherein the predetermined condition includes a first condition, relating to a shape feature of a surface, that is a condition for matching the pseudo guide line expressed as a locus of one point on the profile curve moved by the sweeping process with a flow of surface data to be generated, and in which the pseudo guide line becomes a line of curvature of the surface data;
wherein the sweep process includes a first movement processing and a second movement processing,
the first movement processing is a processing that is obtaining, at every predetermined interval, a tangent vector indicating a direction of the locus obtained by translating one point on the profile curve by performing a movement process for translating the profile curve,
the second movement processing is a processing that is performing further moving the profile curve obtained at every predetermined interval through translating and rotating the profile curve so as to satisfy the predetermined condition by setting each of the tangent vectors obtained at every predetermined interval by the first movement processing as an initial vector; and wherein the second movement processing is a processing that is moving the profile curve by rotation using a rotation minimizing frame without rotation in a direction of the tangent vector by rotating the profile curve about one point on the profile curve such that the tangent vector indicating a direction of next translation of the profile curve matches a tangent vector indicating a direction of translation of the profile curve before the predetermined interval.

21. A method, comprising:

inputting shape data of a model;

setting a profile curve fitted to a part of the shape data;

applying a sweep process by translating and rotating the profile curve and decide a pseudo guide line satisfying a predetermined condition; and generating surface data defined by a locus obtained by adjusting the profile curve using the sweep process, wherein the predetermined condition includes a first condition, relating to a shape feature of a surface, that is a condition for matching the pseudo guide line expressed as a locus of one point on the profile curve moved by the sweep process with a flow of surface data to be generated, and in which the pseudo guide line becomes a line of curvature of the surface data and the pseudo guide line has a small torsion;

wherein the sweep process includes a first movement processing and a second movement processing, the first movement processing is a processing that is obtaining, at every predetermined interval, a tangent vector indicating a direction of the locus obtained by translating one point on the profile curve by performing a movement process for translating the profile curve, the second movement processing is a processing that is further moving the profile curve obtained at every predetermined interval through translating and rotating the profile curve so as to satisfy the predetermined condition by setting each of the tangent vectors obtained at every predetermined interval by the first movement processing as an initial vector; and wherein the second movement processing is a processing that is moving the profile curve by rotation using a rotation minimizing frame without rotation in a direction of the tangent vector by rotating the profile curve about one point on the profile curve such that the tangent vector indicating a direction of next translation of the profile curve matches a tangent vector indicating a direction of translation of the profile curve before the predetermined interval.

* * * * *